(12) United States Patent
Yoon (10) Patent No.: US 8,159,898 B2
(45) Date of Patent: Apr. 17, 2012

(54) ARCHITECTURE OF HIGHLY INTEGRATED SEMICONDUCTOR MEMORY DEVICE

(75) Inventor: Seok-Cheol Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 175 days.

(21) Appl. No.: 12/346,311

(22) Filed: Dec. 30, 2008

(65) Prior Publication Data

US 2009/0185439 A1      Jul. 23, 2009

(30) Foreign Application Priority Data

Jan. 18, 2008   (KR) .................. 10-2008-0005630
Nov. 13, 2008  (KR) .................. 10-2008-0112700

(51) Int. Cl.
*G11C 8/00* (2006.01)
(52) U.S. Cl. .......... 365/230.03; 365/230.06; 365/185.11
(58) Field of Classification Search ............. 365/230.03, 365/230.06, 185.11
See application file for complete search history.

(56) References Cited

U.S. PATENT DOCUMENTS

| | | | |
|---|---|---|---|
| 5,771,199 A | 6/1998 | Lee | |
| 5,923,605 A * | 7/1999 | Mueller et al. ........... | 365/230.03 |
| 5,970,016 A * | 10/1999 | Ohsawa .................. | 365/230.03 |
| 6,310,816 B2 | 10/2001 | Manning | |
| 6,414,868 B1 | 7/2002 | Wong et al. | |
| 7,180,817 B2 * | 2/2007 | Mochida ................. | 365/230.03 |
| 7,715,261 B2 * | 5/2010 | Kim et al. ................... | 365/205 |
| 2002/0105849 A1 * | 8/2002 | Kono et al. ............. | 365/230.03 |
| 2004/0057309 A1 * | 3/2004 | Kato et al. .................... | 365/202 |
| 2008/0123461 A1 * | 5/2008 | Kim et al. ................ | 365/230.03 |

FOREIGN PATENT DOCUMENTS

| | | |
|---|---|---|
| JP | 2005-056529 | 3/2005 |
| KR | 1020020004860 | 1/2002 |
| KR | 1020070101075 A | 10/2007 |

OTHER PUBLICATIONS

Notice of Allowance issued from Korean Intellectual Property Office on Oct. 28, 2010.
Notice of Preliminary Rejection issued from Korean Intellectual Property Office on Apr. 29, 2010.

* cited by examiner

*Primary Examiner* — Vu Le
*Assistant Examiner* — Han Yang
(74) *Attorney, Agent, or Firm* — IP & T Group LLP (57) ABSTRACT

A semiconductor memory device includes: a first row control circuit region corresponding to a first memory bank; a first column control circuit region corresponding to the first memory bank; a second row control circuit region corresponding to a second memory bank and disposed adjacent to the first row control circuit region; and a second column control circuit region corresponding to a third memory bank and disposed adjacent to the first column control circuit region.

8 Claims, 5 Drawing Sheets

ARCHITECTURE OF HIGHLY INTEGRATED SEMICONDUCTOR MEMORY DEVICE

CROSS-REFERENCES TO RELATED APPLICATIONS

The present invention claims priority of Korean patent application numbers 10-2008-0005630 and 10-2008-0112700, filed on Jan. 18, 2008, and Nov. 13, 2008, respectively, which are incorporated by reference in their entirety.

BACKGROUND OF THE INVENTION

The present invention relates to a semiconductor device, and more particularly, to an architecture of a highly integrated semiconductor memory device including a plurality of memory banks for storing data and a variety of internal circuits for performing input/output operations.

A semiconductor memory device such as a double data rate synchronous DRAM (DDR SDRAM) stores or outputs data according to a command received from a data processor device, e.g., a central processor unit (CPU). When a read command is inputted from the CPU, data is stored in a memory cell of the semiconductor memory device, corresponding to an address received from the CPU. When a write command is inputted from the CPU, data is output from a memory cell corresponding to an address received from the CPU.

A semiconductor memory device includes tens of millions or more memory cells. A set of memory cells is referred to as a memory bank. The number of memory banks in the semiconductor memory device is different according to the design, and continues to increase as the semiconductor memory device is developed to achieve a large capacity.

Figure 1:
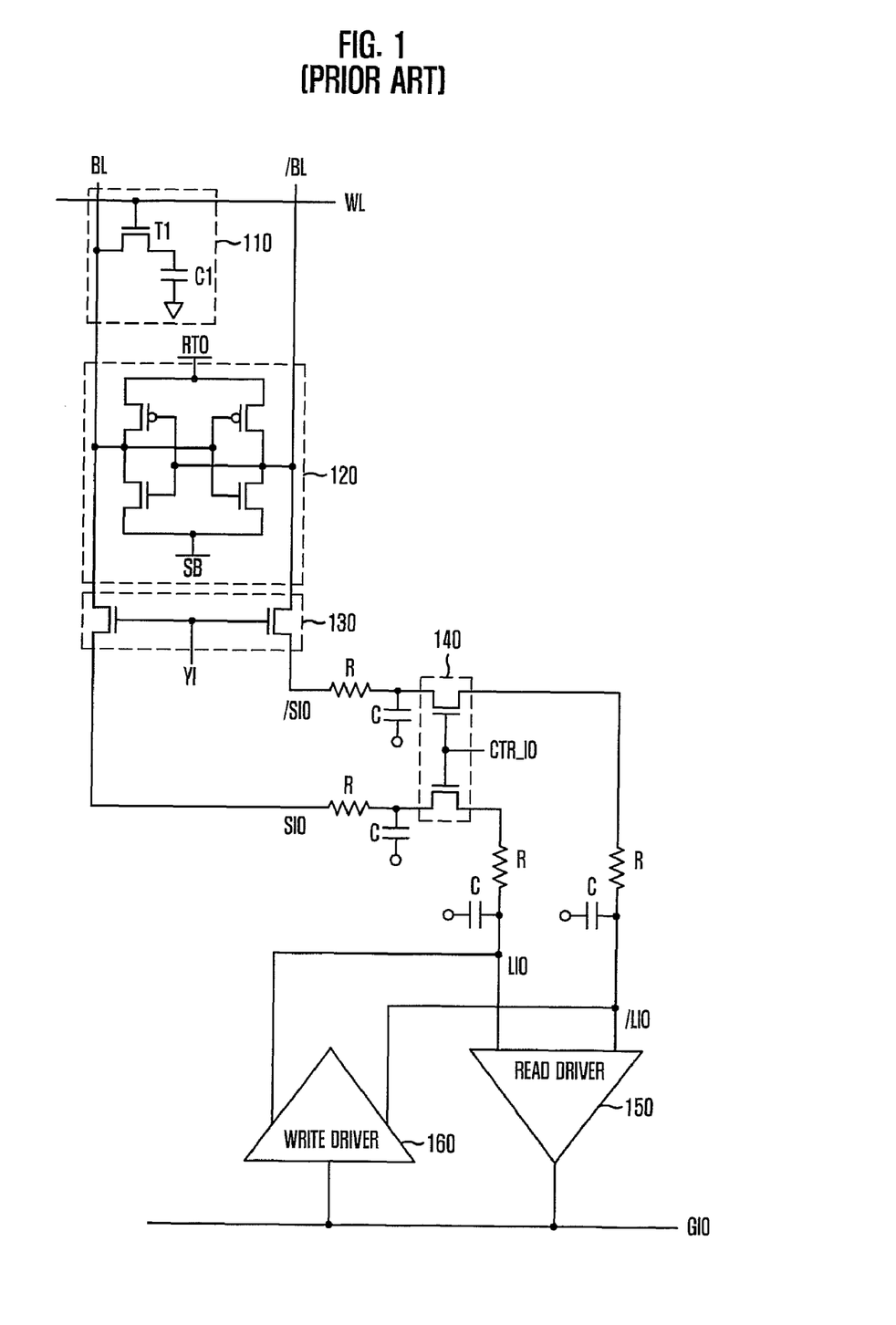
FIG. 1 is a circuit diagram illustrating read and write operations of a typical semiconductor memory device.

FIG. 1 is a circuit diagram illustrating read and write operations of a conventional semiconductor memory device. For convenience of explanation, only one memory cell having the reference numeral of 110 is shown in FIG. 1.

The read operation of the conventional semiconductor memory device will be described briefly with reference to FIG. 1.

As a read command is inputted to the semiconductor memory device, an inputted row address is decoded to enable a corresponding word line WL. Then, a cell transistor T1 of the memory cell 110 is turned on so that charge sharing occurs between a cell capacitor C1 and a bit line BL or a bit line bar /BL. As a result, there is a slight voltage difference between the bit line BL and the bit line bar /BL.

A bit line sense amplifier 120 senses and amplifies the voltage difference. That is, when the potential of the bit line BL is higher than that of the bit line bar /BL, the voltage of the bit line BL is amplified to a pull-up power supply voltage RTO and that of the bit line bar /BL is amplified to a pull-down power supply voltage SB. On the contrary, when the potential of the bit line BL is lower than that of the bit line bar /BL, the voltage level of the bit line BL is amplified to the pull-down power supply voltage SB and that of the bit line bar /BL is amplified to the pull-up power supply voltage RTO.

An inputted column address is also decoded to activate a column selection signal YI. Then, a column selector 130 is enabled so that the bit line BL and bit line bar /BL are connected to the segment input/output line SIO and the segment input/output line bar /SIO, respectively. That is, the data on the bit line BL is transferred to the segment input/output line SIO and the data on the bit line bar /BL is transferred to the segment input/output line bar /SIO.

Thereafter, an input/output switch 140 is enabled in response to an input/output control signal CTR_IO so that the segment input/output line SIO and the segment input/output line bar /SIO are connected to the local input/output line LIO and the local input/output line bar /LIO. That is, the signal on the segment input/output line SIO is transferred to the local input/output line LIO, and the signal on the segment input/output line bar /SIO is transferred to the local input/output line bar /LIO. A read driver 150 receives the data from the local input/output line LIO and the local input/output line bar /LIO to drive a global input/output line GIO.

Resultantly, the data in the memory cell 110 is transferred from the bit line BL and the bit line bar /BL to the segment input/output line SIO and the segment input/output line bar /SIO, respectively, in response to the column selection signal YI. The data on the segment input/output line SIO and the segment input/output line bar /SIO is transferred to the local input/output line LIO and the local input/output line bar /LIO, respectively, in response to the input/output control signal CTR_IO. The data on the local input/output line LIO and the local input/output line bar /LIO is transferred to the global input/output line GIO by the read driver 150. Finally, the data on the global input/output line GIO is outputted to the outside through a corresponding input/output pad (not shown).

In a write operation, the data received from the outside is transferred in the reverse direction, compared with the read operation. That is, the data inputted through the input/output pad is transferred through the global input/output line GIO, and transferred to the local input/output line LIO and the local input/output line bar /LIO by a write driver 160. Then, the data is transferred to the segment input/output line SIO and the segment input/output line bar /SIO, transferred to the bit line BL and the bit line bar /BL, and finally stored in the memory cell 110.

Figure 2:
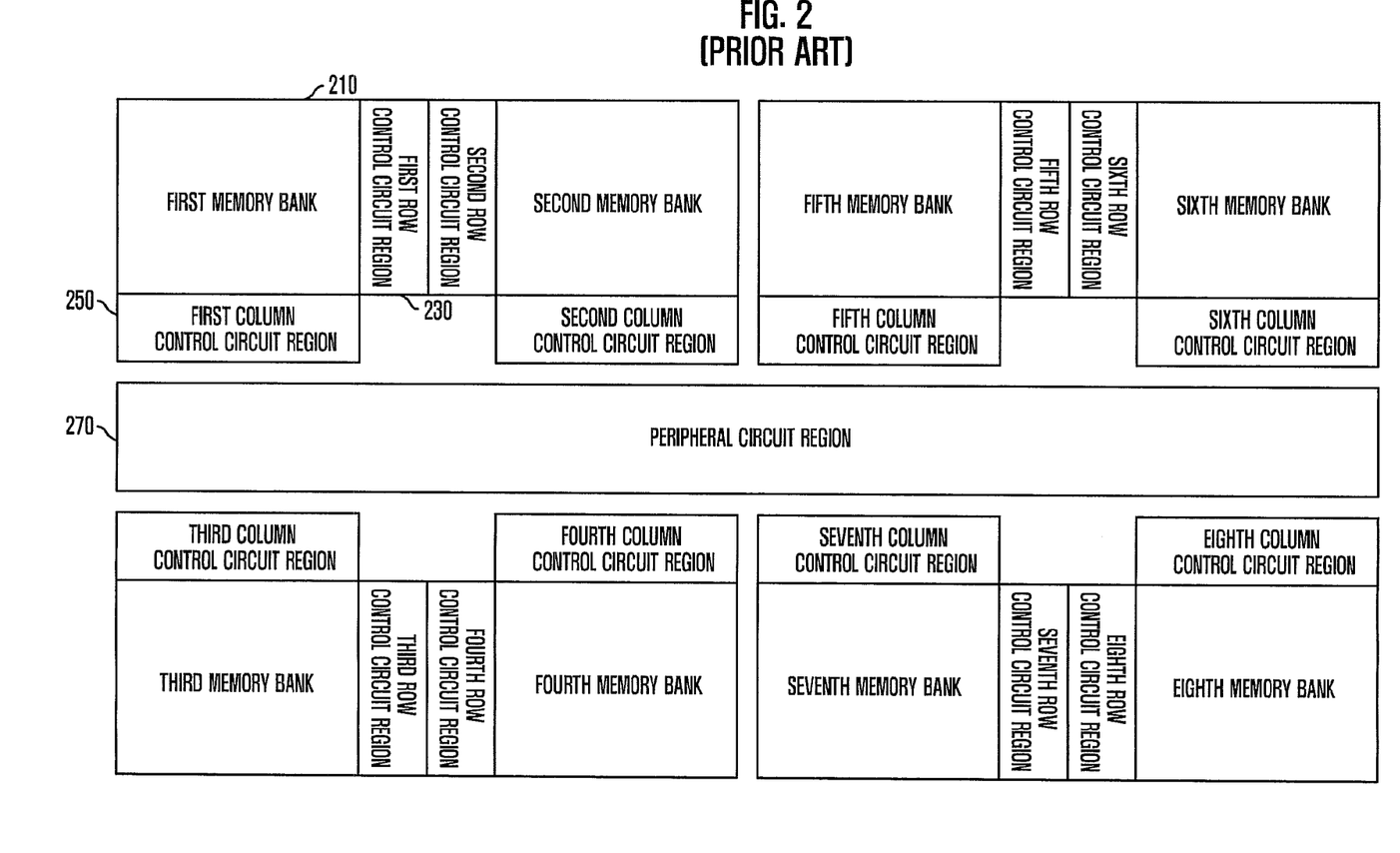
FIG. 2 is a block diagram illustrating a memory bank structure of the typical semiconductor memory device.

FIG. 2 is a block diagram illustrating a memory bank structure of a conventional semiconductor memory device. For convenience of explanation, a semiconductor memory device having eight memory banks will be described as an example.

Referring to FIG. 2, the semiconductor memory device includes first to eighth memory banks, and row control circuit regions and column control circuit regions corresponding to the respective memory banks. The first memory bank 210, the first row control circuit region 230 and the first column control circuit region 250 corresponding to the first memory bank 210 will be described, as an example.

As described above, the first memory bank 210 includes a plurality of memory cells. The first row control circuit region 230 includes circuits for controlling row access to the first memory bank 210, and the first column control circuit region 250 includes circuits for controlling column access to the first memory bank 210.

Although not shown specifically, the first row control circuit region 230 includes a row decoder, a power supply voltage controller and a row redundancy controller. The row decoder decodes an address received from the CPU to select the word line WL (see FIG. 1). The power supply voltage controller controls the pull-up power supply voltage RTO and the pull-down power supply voltage SB applied to the bit line sense amplifier 120. Here, the pull-up power supply voltage RTO and the pull-down power supply voltage SB are voltages generated based on the external power supply voltage and the ground voltage. The row redundancy controller replaces a word line connected to a defective memory cell by another word line connected to a normal memory cell.

Although not shown specifically, the first column control circuit region 250 includes a column decoder, a read driver, a write driver and a column redundancy controller. The column decoder decodes an address received from the CPU to select column selection signal YI (see FIG. 1) for the corresponding memory cell. The read driver 150 (see FIG. 1) outputs data read from the memory bank according to the read command. The write driver 160 (see FIG. 1) transfers the data received from the outside to the corresponding memory bank according to the write command. The column redundancy controller replaces a column selection signal YI corresponding to a defective memory cell to another column selection signal YI corresponding to a normal memory cell. Here, the column redundancy operation is performed by replacing a column address corresponding to the defective memory cell to a column address corresponding to the normal memory cell.

The first, second, fifth and sixth memory banks are disposed in a line along a row direction. The third, fourth, seventh and eighth memory banks are also disposed in a line along the row direction. Between the set of the first, second, fifth and sixth memory banks and the set of the third, fourth, seventh and eighth memory banks, a peripheral circuit region 270 is disposed.

The peripheral circuit region 270 includes a plurality of pads (not shown) for receiving a power supply voltage, a data, an address, an external command, a clock signal and the like, and a plurality of transfer lines for transferring the signals inputted through the pads. The semiconductor memory device performs a variety of operations based on the signals inputted through the pads.

The row control circuit regions and the column control circuit regions also include a plurality of transfer lines, respectively. The transfer lines include power supply voltage lines, address lines and test lines. Circuits included in the row control circuit regions and the column control circuit regions receive power supply voltages through the power supply voltage lines, addresses through the address lines, and signals related to a variety of test operations through the test lines. That is, each of the first to eighth row control circuit regions includes a power supply voltage line, an address line and a test line, and each of the first to eighth column control circuit regions also includes a power supply voltage line, an address line and a test line.

As a semiconductor memory device becomes highly integrated, the efforts to reduce the chip size of the semiconductor memory device are being continued to improve the productivity. Actually, as the chip size decreases, the number of chips per wafer increases, resulting in production cost economies. However, in the conventional memory bank structure of the semiconductor memory device, it is difficult to reduce the chip size because of power supply voltage lines, address lines and test lines for each row control circuit region and column control circuit region.

Recently, as the capacity of the semiconductor memory device increases, the number of memory banks and thus the required size of the row control circuit regions and the column control circuit regions also increase accordingly. Consequently, the increasing number of power supply voltage lines, address lines and test lines places a burden on the chip size.

SUMMARY OF THE INVENTION

Exemplary embodiments of the present invention are directed to a semiconductor memory device where row control circuit regions for adjacent memory banks are disposed adjacent to each other, and column control circuit regions for adjacent memory banks are also disposed adjacent to each other.

Exemplary embodiments of the present invention are also directed to a semiconductor memory device where adjacent row control circuit regions share a predetermined transfer line and adjacent column control circuit regions also share a predetermined transfer line.

In accordance with an aspect of the present invention, there is provided a semiconductor memory device, including: a first row control circuit region corresponding to a first memory bank; a first column control circuit region corresponding to the first memory bank; a second row control circuit region corresponding to a second memory bank and disposed adjacent to the first row control circuit region; and a second column control circuit region corresponding to a third memory bank and disposed adjacent to the first column control circuit region.

In accordance with another aspect of the present invention, there is provided a semiconductor memory device including: first and second bank groups with a plurality of memory banks, each having a row control circuit region and a column control circuit region disposed adjacent to a row control circuit region and a column control circuit region of an adjacent memory bank, respectively; and a peripheral circuit region disposed between the first bank group and the second bank group to transfer signal between the first and second bank groups and a pad.

According to the embodiments of the present invention, the row control circuit regions for a plurality of memory banks are disposed adjacent to each other, and the column control circuit regions for a plurality of memory banks are also disposed adjacent to each other. As a result, it is possible to share the transfer lines, otherwise required for respective row control circuit regions and for respective column control circuit regions. Thus may make it possible to reduce the chip size corresponding to the reduced number of transfer lines.

In addition, it is possible to reduce the length of the peripheral circuit region, and thus to reduce the length of the transfer lines in the peripheral circuit region. As a result, the reduced length of the transfer lines may result in a reduced loading time, and thus a more rapid operation of the semiconductor memory device.

DESCRIPTION OF SPECIFIC EMBODIMENTS

Other objects and advantages of the present invention can be understood by the following description, and become apparent with reference to the embodiments of the present invention.

Figure 3:
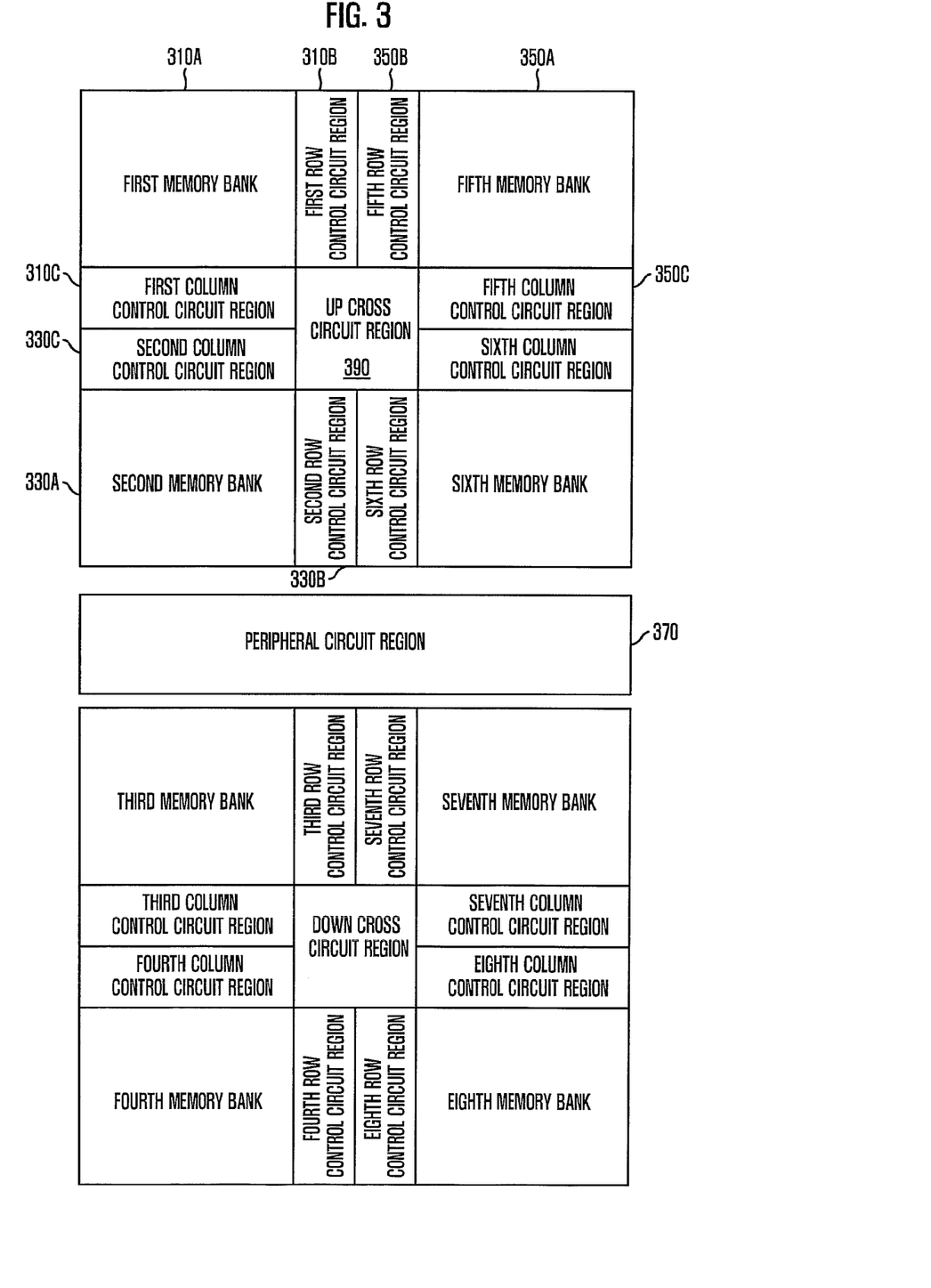
FIG. 3 is a block diagram illustrating a memory bank structure of a semiconductor memory device in accordance with an embodiment of the present invention.

FIG. 3 is a block diagram illustrating a memory bank structure of a semiconductor memory device in accordance with an embodiment of the present invention. For convenience of explanation, the semiconductor memory device including eight memory banks will be described as an example.

Referring to FIG. 3, the semiconductor memory device includes first to eighth memory banks. Each of the memory banks is provided with a row control circuit region and a column control circuit region. Herebelow, the first memory bank 310A, and the second and fifth memory bank 330A and 350A adjacent to the first memory bank 310A will be described as an example.

The first memory bank 310A is provided with a first row control circuit region 310B in a row direction and a first column control circuit region 310C in a column direction. Similarly, the second memory bank 330A is provided with a second row control circuit region 330B in the row direction and a second column control circuit region 330C in the column direction, and the fifth memory bank 350A is provided with a fifth row control circuit region 350B in the row direction and a fifth column control circuit region 350C in the column direction.

Each of the row control circuit regions includes circuits for controlling row access to the corresponding memory bank, and each of the column control circuit regions includes circuits for controlling column access to the corresponding memory bank.

Herebelow, each of the row control circuit regions and column control circuit regions will be described in more detail with reference to FIGS. 4 and 5.

Figure 4:
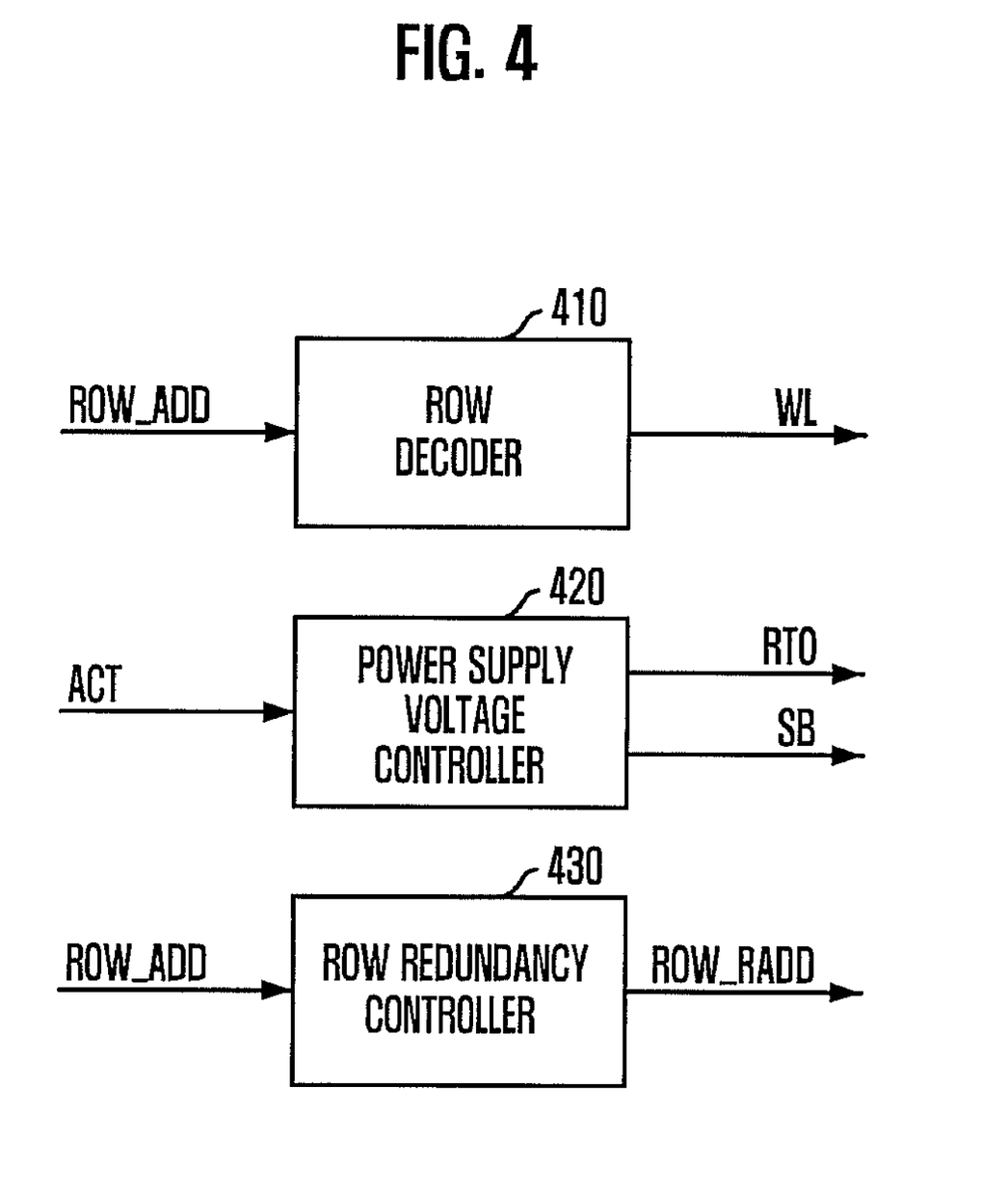
FIG. 4 is a block diagram illustrating a row control circuit region described in FIG. 3.

FIG. 4 is a block diagram illustrating a row control circuit region described in FIG. 3.

As shown, each of the row control circuit regions includes a row decoder 410, a power supply voltage controller 420 and a row redundancy controller 430. The row decoder 410 decodes row address information ROW_ADD to select the word line WL (see FIG. 1). The power supply voltage controller 420 controls the pull-up power supply voltage RTO and the pull-down power supply voltage SB applied to the bit line sense amplifier 120 (see FIG. 1) in active command ACT. Here, the pull-up power supply voltage RTO and the pull-down power supply voltage SB are voltages generated based on the external power supply voltage and the ground voltage, and may be transferred through a shared power supply voltage line, which will be described later. The row redundancy controller 430 receives the row address information ROW_ADD and outputs a row redundancy address ROW_RADD for replacing a word line connected to a defective memory cell by another word line connected to a normal memory cell.

Figure 5:
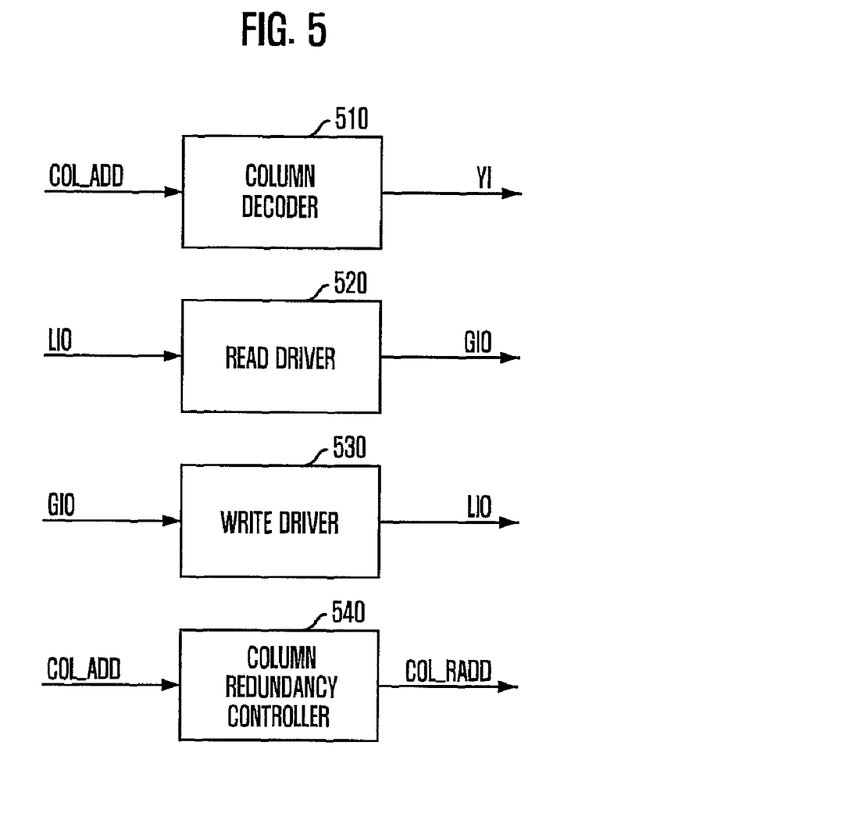
FIG. 5 is a block diagram illustrating a column control circuit region described in FIG. 3.

FIG. 5 is a block diagram illustrating a column control circuit region described in FIG. 3.

As shown, each of the column control circuit regions includes a column decoder 510, a read driver 520, a write driver 530 and a column redundancy controller 540. The column decoder 510 decodes column address information COL_ADD to select column selection signal YI (see FIG. 1) for the corresponding memory cell. The read driver 150 (see FIG. 1) outputs data, read from the memory bank (though a local I/O line LIO), to global I/O line GIO according to the read command. The write driver 160 (see FIG. 1) transfers the data received though a global I/O line GIO from the outside to the corresponding memory bank (though a local I/O line LIO) according to the write command. The column redundancy controller replaces a column address information COL_ADD corresponding to a defective memory cell to a column redundancy address information COL_RADD corresponding to a normal memory cell. Here, the column redundancy operation is performed by replacing a column address corresponding to the defective memory cell to a column address corresponding to the normal memory cell.

The first row control circuit region 310B and the fifth row control circuit region 350B are disposed adjacent to each other, and the first column control circuit region 310C and the second column control circuit region 330C are disposed adjacent to each other. Accordingly, the first row control circuit region 310B and the fifth row control circuit region 350B can share a transfer line, and the first column control circuit region 310C and the second column control circuit regions 330C can also share a transfer line. Here, the shared transfer line may include a power supply voltage line, an address line, a test line, and the like.

In a conventional semiconductor memory device, each of the plurality of row control circuit regions and the plurality of column control circuit regions needs corresponding power supply voltage line, address line and test line for structural reason. However, in the semiconductor memory device in accordance with the embodiment of the present invention, the row control circuit region and the column control circuit region provided to a memory bank are disposed adjacent to the row control circuit region and the column control circuit region provided to another memory bank adjacent to the memory bank, respectively. Resultantly, the power supply voltage line, the address line and the test line can be shared by adjacent row control circuit regions or adjacent column control circuit regions. As such, it is possible to reduce the number of transfer lines, and thus reduce the chip size of the semiconductor memory device.

As the semiconductor memory device is developed to achieve a large capacity, the number of addresses applied from the outside increases accordingly. Accordingly, pre-decoding of the address is carried out nowadays to effectively process such a large number of addresses. The semiconductor memory device may include a circuit for the pre-decoding, which is disposed on a so-called "cross circuit region."

Herebelow, an up bank group and a down bank group will be described before describing the cross circuit region. The up bank group refers to circuits disposed on the upside of the peripheral circuit region 370. That is, the up bank group includes the first memory bank 310A, the second memory bank 330A, the fifth memory bank 350A and the sixth memory bank, and the row control circuit regions and the column control circuit regions corresponding thereto. In addition, the up bank group includes an up cross circuit region 390 where the row control circuit regions and the column control circuit regions cross.

The down bank group refers to circuits disposed on the downside of the peripheral circuit region 370. That is, the down bank group includes the third, fourth, seventh and eighth memory banks, and the row control circuit regions and the column control circuit regions corresponding thereto. In addition, the down bank group may include a down cross circuit region where the row control circuit regions and the column control circuit regions cross.

As shown in FIG. 3, each of the memory banks may be stacked to reduce the length of the peripheral circuit region 370. It is possible to reduce the length of the transfer lines in the peripheral circuit region 370. The transfer lines in the peripheral circuit region 370 include a global input/output line (GIO) for transferring data between pads (not shown) and the circuits included in the up bank group and the down bank group. Reduction of the length of the global input/output line reduces the loading time for the data transfer, improving the operation speed.

Figure 6:
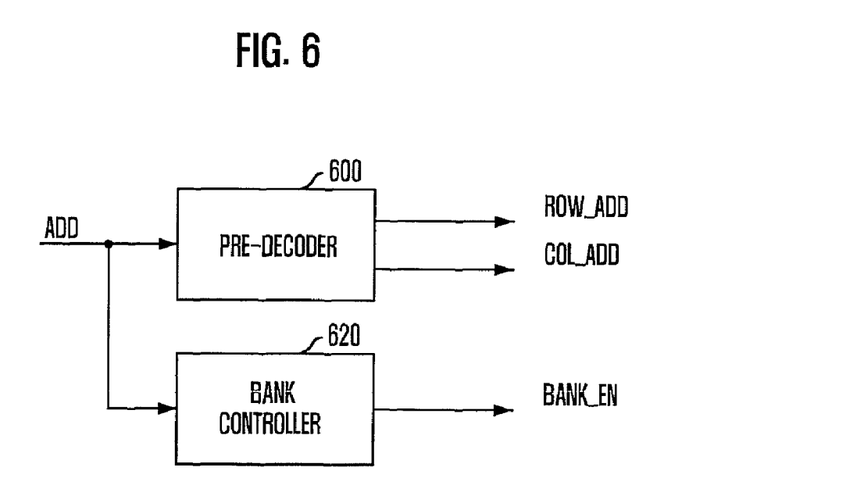
FIG. 6 is a block diagram illustrating a cross circuit region described in FIG. 3.

As described above, the semiconductor memory device may include the up cross circuit region 390 and the down cross circuit region. For illustration purposes, the up cross circuit region 390 will be described below as an example. FIG. 6 is a block diagram illustrating a cross circuit region described in FIG. 3.

As shown, the up cross circuit region 390 includes a pre-decoder 600 and a bank controller 620. The pre-decoder 600 generates row address information ROW_ADD and column address information COL_ADD by pre-decoding the address information ADD. The bank controller 620 generates a bank active signal BANK_EN for controlling the memory banks included in the up bank group in response to the address information ADD. That is, the memory banks included in the up bank group are enabled in response to a bank activation signal (not shown) output from the up cross circuit region 390. The row control circuit regions and the column control circuit regions included in the up bank group operate according to an address pre-decoded by the up cross circuit region 390. Also, the down cross circuit region may include circuits similar to those of the up cross circuit region.

As shown in FIG. 3, the semiconductor memory device includes one up cross circuit region 390 and one down cross circuit region. Referring back to FIG. 2, the conventional semiconductor memory device includes two of such regions (not shown) for the up bank group and two of such regions (not shown) for the down bank group, respectively. Accordingly, the conventional semiconductor memory device includes at least four groups of the transfer lines for transferring the address. However, for the semiconductor memory device in accordance with the embodiment, the up cross circuit region 390 receives an address through shared transfer lines corresponding to four memory banks of the up bank group. Similarly, the down cross circuit region receives an address through shared transfer lines corresponding to four memory banks. That is, the semiconductor memory device needs only two of the transfer line groups corresponding to the up bank group and the down bank group, respectively.

Furthermore, the required number of the cross circuit regions is also reduced from four to two, and thus the required number of the transfer lines, such as the power supply voltage lines, can also be reduced. Resultantly, as the number of cross circuit regions is reduced, and thus the number of the transfer lines is also reduced, it is possible to further reduce the chip size of the semiconductor memory device.

It is possible that the four row control circuit regions of the up bank group share every transfer lines possible. In this case, the transfer line may be disposed across the up cross circuit region 390. Similarly, the four column control circuit regions of the up bank group may share every transfer line possible, and the row control circuit region and the column control circuit region of the down bank group may also share every transfer line possible.

As the semiconductor memory device becomes highly integrated and the number of memory banks increases accordingly, the above described configuration of the semiconductor memory device may be highly useful in reducing the chip size of the semiconductor memory device. Such a reduction of the chip size allows the number of chips per wafer to increase, resulting in production cost economies.

As described above, in the semiconductor memory device in accordance with the embodiments, the row control circuit regions for the adjacent memory banks are disposed adjacent to each other and the column control circuit regions for the adjacent memory banks are also disposed adjacent to each other to share the transfer lines. As such, it is possible to reduce the required number of the transfer lines, thereby reducing the chip size of the highly integrated semiconductor memory device.

Also, the memory banks are stacked to reduce the size of the peripheral circuit region. As such, it is possible to further reduce the chip size of the semiconductor memory device and secure more rapid circuit operations.

Furthermore, by reducing the chip size, it is possible to increase the number of chips per wafer, resulting in production cost economies.

For example, although the row control circuit regions and the column control circuit regions have been described to share the power supply voltage line, the address line and the test line in the above described embodiment, it is also possible that they share other transfer lines possible.

In addition, although the length of the global input/output line (GIO, not shown) disposed in the peripheral circuit region 370 has been described to be shorten in the above described embodiment, it is also possible that the lengths of other lines in the peripheral circuit region are shorten because the length of the peripheral circuit region itself is shorten for the stacking of the memory banks.

Furthermore, the locations of the row control circuit regions and the column control circuit regions for the memory banks may be different according to the design.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
first and second bank groups with a plurality of memory banks; and
a peripheral circuit region disposed between the first bank group and the second bank group to transfer signal between the first and second bank groups and a pad, wherein the peripheral circuit region separates the first bank group and the second bank group,
wherein each of the first and second bank groups includes:
a first row control circuit region corresponding to a first memory bank;
a first column control circuit region corresponding to the first memory bank;
a second row control circuit region corresponding to a second memory bank;
a second column control circuit region corresponding to a second memory bank and disposed adjacent to the first column control circuit region;
a third row control circuit region corresponding to a third memory bank and disposed adjacent to the first row control circuit region;
a third column control circuit region corresponding to the third memory bank;
a fourth row control circuit region corresponding to a fourth memory bank and disposed adjacent to the second row control circuit region; and
a fourth column control circuit region corresponding to the fourth memory bank and disposed adjacent to the third column control circuit region,
wherein two adjacent column control circuit regions are arranged in parallel without a peripheral circuit region therebetween,
wherein two adjacent row control circuit regions are arranged in parallel without the peripheral circuit region therebetween.

2. The semiconductor memory device of claim 1, further comprising a cross circuit region disposed where the row control circuit regions and the column control circuit regions cross.

3. The semiconductor memory device of claim 2, wherein the cross circuit region includes:
   a decoder configured to decode an address; and
   a bank controller configured to enable the memory bank.

4. The semiconductor memory device of claim 2, wherein the cross circuit region is configured to receive an address from an outside through a common transfer line.

5. The semiconductor memory device of claim 1, wherein the first column control circuit region and the second column control circuit region share a first transfer line, and the first row control circuit region and the second row control circuit region share a second transfer line.

6. The semiconductor memory device of claim 5, wherein each of the first and second transfer lines transfers at least one of an address, a test signal and a power supply voltage.

7. The semiconductor memory device of claim 1, wherein each of the first and second row control circuit regions includes:
   a row decoder configured to decode the address to select a word line for a corresponding memory bank;
   a power supply voltage controller configured to receive the power supply voltage to control a voltage to be applied to a bit line sense amplifier for the corresponding memory bank; and
   a row redundancy controller configured to replace a word line connected to a defective memory cell by another word line connected to a normal memory cell.

8. The semiconductor memory device of claim 1, wherein each of the first and second column control circuit regions includes:
   a column decoder configured to decode the address to select a memory cell in a corresponding memory bank;
   a read driver configured to output data read from the corresponding memory bank in response to a read command;
   a write driver configured to transfer data received from an outside to the corresponding memory bank in response to a write command; and
   a column redundancy controller configured to replace a column address corresponding to a defective memory cell to another column address corresponding to a normal memory cell.

* * * * *